United States Patent [19]
Mahulikar et al.

[11] Patent Number: 5,688,606
[45] Date of Patent: Nov. 18, 1997

[54] ANODIZED ALUMINUM SUBSTRATE HAVING INCREASED BREAKDOWN VOLTAGE

[75] Inventors: Deepak Mahulikar, Madison; Efraim Sagiv, Meriden; Arvind Parthasarathi, North Branford; Satish Jalota, Wallingford; Andrew J. Brock, Cheshire, all of Conn.; Michael A. Holmes, Ripon, Calif.; Jeffrey M. Schlater, Oakdale, Calif.; German J. Ramirez, Antioch, Calif.; Dexin Liang, Fremont, Calif.

[73] Assignee: Olin Corporation, New Haven, Conn.

[21] Appl. No.: 633,256

[22] Filed: Apr. 18, 1996

Related U.S. Application Data

[62] Division of Ser. No. 427,921, Apr. 26, 1995, Pat. No. 5,534,356.

[51] Int. Cl.$^6$ ............... B32B 15/00; B32B 3/00; B21D 39/00; C25D 5/18
[52] U.S. Cl. ............... 428/615; 428/624; 428/650; 428/209; 205/105; 205/106
[58] Field of Search ............... 428/615, 209, 428/650, 624; 205/80, 105, 106

[56] References Cited

U.S. PATENT DOCUMENTS

| | | | |
|---|---|---|---|
| 4,188,652 | 2/1980 | Smolko | 361/402 |
| 4,301,765 | 11/1981 | Behn et al. | 118/718 |
| 4,491,622 | 1/1985 | Butt | 428/632 |
| 4,495,378 | 1/1985 | Dotzer et al. | 174/68.5 |
| 4,499,118 | 2/1985 | Dietz et al. | 427/28 |
| 4,570,337 | 2/1986 | Butt | 29/840 |
| 4,582,556 | 4/1986 | Butt et al. | 156/325 |
| 4,594,770 | 6/1986 | Butt | 29/588 |
| 4,611,745 | 9/1986 | Nakahashi et al. | 228/123 |
| 4,682,414 | 7/1987 | Butt | 29/840 |
| 4,696,851 | 9/1987 | Pryor | 428/210 |
| 4,827,377 | 5/1989 | Butt | 361/401 |
| 4,842,959 | 6/1989 | Maeda et al. | 428/630 |
| 4,853,491 | 8/1989 | Butt | 174/52.4 |
| 4,862,323 | 8/1989 | Butt | 361/388 |
| 4,866,571 | 9/1989 | Butt | 361/386 |
| 4,888,449 | 12/1989 | Crane et al. | 174/52.4 |
| 4,939,316 | 7/1990 | Mahulikar et al. | 174/52.4 |
| 4,953,001 | 8/1990 | Kaiser, Jr. et al. | 357/74 |
| 4,967,260 | 10/1990 | Butt | 357/70 |
| 5,013,871 | 5/1991 | Mahulikar et al. | 174/52.4 |
| 5,055,967 | 10/1991 | Sukonnik et al. | 361/387 |
| 5,066,368 | 11/1991 | Pasqualoni et al. | 204/58 |
| 5,077,595 | 12/1991 | Fukunaga | 357/40 |
| 5,103,292 | 4/1992 | Mahulikar | 357/74 |
| 5,256,205 | 10/1993 | Schmitt III et al. | 118/723 |

OTHER PUBLICATIONS

CRC Handbook of Chemistry and Physics, 69th Edition. 1988–1989. "Physical Constants of Inorganic Compounds" at pp. B–85; B–103; B–105 and B–126.

*Primary Examiner*—Cathy F. Lam
*Attorney, Agent, or Firm*—Gregory S. Rosenblatt; Wiggin & Dana

[57] ABSTRACT

There is provided an anodizable aluminum substrate having an increased breakdown voltage. The increase in breakdown voltage is achieved by selecting an appropriate aluminum alloy and appropriate processing parameters. Sealing the anodic film increases the breakdown voltage by decreasing corrosion. A preferred sealant is an epoxy cresol novolac having a low room temperature viscosity that cures to a highly cross-linked polymer.

7 Claims, 4 Drawing Sheets

ANODIZED ALUMINUM SUBSTRATE HAVING INCREASED BREAKDOWN VOLTAGE

CROSS REFERENCE TO RELATED APPLICATION

This is a division of patent application Ser. No. 08/427,921, filed on Apr. 26, 1995, that is now U.S. Pat. No. 5,534,356 and is incorporated herein by reference in its entirety.

BACKGROUND OF THE INVENTION

1. Field of the Invention

This invention relates to anodized aluminum substrates for electronic package and printed circuit board applications. More particularly, the breakdown voltage of an anodic film is increased by selection and processing of the aluminum core and by sealing pores in the anodic film.

2. Description of Related Art

Anodized aluminum substrates are used in electronic packaging applications as disclosed in U.S. Pat. No. 4,939,316 to Mahulikar et al. that is incorporated by reference in its entirety herein. Mahulikar et al. disclose an adhesively sealed electronic package having anodized aluminum base and cover components. A leadframe is disposed between and bonded to both the base and the cover. An integrated circuit device is adhesively bonded either to the package base or to an intervening die paddle.

The breakdown voltage is one property of interest to electronic package designers. The breakdown voltage is the voltage that when applied across a dielectric layer causes an irreversible degradation of that dielectric layer and is accompanied by an increase in electrical conductivity of several orders of magnitude.

The breakdown voltage is not critical in electronic packages of the type disclosed in U.S. Pat. No. 4,939,316 because a thick polymer layer separates the circuits and the leadframe from the anodized substrate. However, recent electronic package designs include circuitry deposited directly on the anodization layer by processes as diverse as direct writing, screen printing, electrolytic plating, electroless plating, vaporization, sputtering and vapor deposition. With circuits formed directly on the anodization layer, the breakdown voltage has become much more critical.

Examples of electronic packages having conductive circuitry formed directly on the anodization layer are disclosed in U.S. patent application Ser. No. 08/134,993, entitled "Edge Connectable Electronic Package" by Hoffman et al. that was filed on Oct. 12, 1993 (now abandoned in favor of File Wrapper Continuation patent application Ser. No. 08/435,237) and U.S. patent application Ser. No. 08/277,387 entitled "Integrally Bumped Electronic Package Components" by Mahulikar et al. that was filed on Jul. 19, 1994, both of which are incorporated by reference in their entireties herein.

Maximizing the breakdown voltage is now an objective of electronic package design. Several factors influencing the breakdown voltage are illustrated in FIG. 1. An anodized aluminum component 10 has an aluminum or aluminum alloy core 12 coated with an anodization layer 14 having a typical thickness of from about 0.013 mm to about 0.075 mm (0.0005–0.003 inch). The anodization layer is deposited by an electrolytic process as known in the art. One such process, integral color anodization, is disclosed in U.S. Pat. No. 5,066,368 to Pasqualoni et al. that is incorporated by reference in its entirety herein. An anodization layer is formed by immersing an aluminum alloy in an electrolyte containing 1–4 g/l sulfuric acid and 50–120 g/l sulfosalicylic acid. A direct electric current is then impressed across the electrolyte with the aluminum alloy as the anode for a time effective to form an anodic film of a desired thickness.

Common defects that reduce the breakdown voltage include intermetallics 16 and surface defects 18. Pores 20 trap contaminants 22 which can corrode the anodic film, further reducing the breakdown voltage.

The intermetallics 16 average up to 20 microns in length along the longest axis and may contain non-anodizable, electrically conductive alloy constituents such as Al—Fe—Si, $FeAl_3$ and $MnAl_6$.

The anodic film 14 is thin and surface defects are not completely filled in. The result is a crevice or pit that reduces the breakdown voltage.

Increasing the thickness of the anodic film does increase the breakdown voltage, but is not an effective solution. A thick anodic film reduces the dissipation of heat through the film to the aluminum core and increases the propensity of the anodic film to cracking. Additionally, increasing the film thickness increases the anodization time and power requirements, increasing the cost of the component.

To maximize the breakdown voltage, it is therefore desired to reduce the above stated defects as well as others.

SUMMARY OF THE INVENTION

Accordingly, it is an object of the invention to provide an anodized aluminum component having a high breakdown voltage. It is a feature of the invention that the breakdown voltage is increased by eliminating defects in both an aluminum alloy core and in the anodic film through proper selection of the core, thermal treatment of the core, polishing of the core and sealing of pores in the anodic film.

An advantage of the invention is that increasing the breakdown voltage improves the electrical performance of electronic packages and printed circuit boards.

In accordance with the invention, there is provided a component for electronic packages. This component has an anodizable metal core and an anodic film coating at least a portion of the core. At least one of the following conditions is satisfied, intermetallics in the core have an average longest axis of less than about 8 microns, the average surface roughness of the core is less than about 3 microns or the anodic film is sealed with a polymer having a thickness of less than about 2 microns that effectively reduces the surface roughness.

The preferred polymer for sealing the anodic film is an epoxy that consists essentially of from about 58% to about 88% of an epoxy cresol novolac, from about 10% to about 40% of a substantially aromatic hardener having multifunctionality, from about 0.1% to about 1.0% of an accelerator and from about 0.001% to about 1% of an additive selected from the group consisting of surfactants, defoamers, levelling agents and mixtures thereof.

The above stated objects, features and advantages will become more apparent from the specification and drawings that follow.

DETAILED DESCRIPTION

Figure 1:
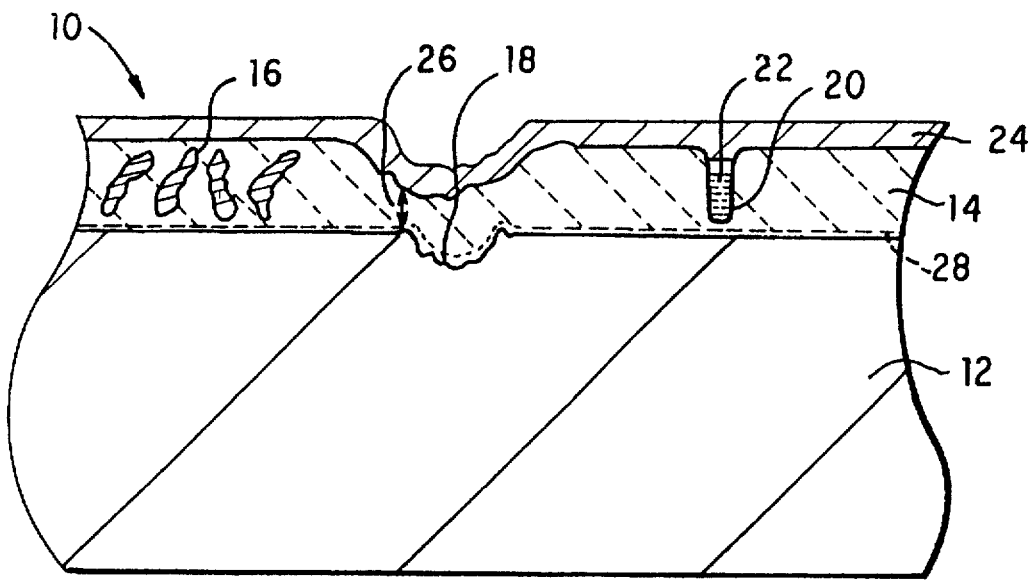
FIG. 1 shows in cross-sectional representation defects that reduce the breakdown voltage of a prior art anodized substrate.

With reference to FIG. 1, the breakdown voltage is increased by changing the size, the composition or the number of intermetallic particles 16 in the anodic film 14. The size of the intermetallic particles 16 is reduced by changing the processing of the core. When aluminum alloy A3003 (nominal composition, by weight, 0.05%–0.20% copper, 1.0%–1.5% manganese and the balance aluminum) is direct chill cast and then rolled to gauge, the intermetallic particles are up to about 20 microns in length along the longest axis. By strip casting to near gauge, the intermetallic particle length along the longest axis is less than about 10 microns. Preferably, the intermetallic particle 16 have no axis with a length longer than from about 5 to about 8 microns.

Rather than reduce the size of the intermetallics 16, the conductivity of the particles is significantly reduced when the core 12 contains predominantly alloy constituents that are soluble in the electrolyte such as magnesium and is substantially free of alloy constituents that are insoluble in the electrolyte such as iron and magnesium. The preferred aluminum alloys are those of the 1000, 5000 and 6000 series as designated by the Aluminum Association Incorporated.

1000 series alloys are 99%, by weight, or higher aluminum.

5000 series alloys contain magnesium and usually chromium as well.

6000 series alloys contain silicon and magnesium in approximate proportions to form magnesium silicide.

For electronic package applications, such as printed circuit boards and electronic package components, alloys of the 1000 series are not suitable because the yield strength, in the range of 5–20 ksi depending on the temper, is too low. Processing of components formed from 1000 series alloys leads to surface damage, warping and bending. A yield strength of at least 30 ksi and preferably in excess of 40 ksi is required for the satisfactory processing of electronic components.

Alloys of the 5000 series and of the 6000 series have satisfactory yield strengths and anodization capability. Particularly preferred is aluminum alloy 6061 (nominal composition, by weight, 0.4%–0.8% silicon, 0.15%–0.4% copper, 0.8%–1.2% magnesium, 0.04%–0.35% chromium and the balance aluminum). In a T6 temper (solution heat treated and aged for precipitation hardening), the yield strength exceeds 42 ksi and the breakdown voltage exceeds 200 volts for a 0.025 mm (0.001 inch) thick anodic film. When anodized at constant voltage, such as during integral color anodizing, aluminum alloy 6061 anodizes at a higher rate resulting in thicker oxides being formed in a given time than are formed on aluminum alloy 3003.

The increased yield strength of aluminum alloy 6061 means that surface defects 18 are less likely to form during processing and handling of the aluminum alloys.

The major alloying addition to aluminum alloy 6061 is magnesium, which is soluble in a sulfuric acid based electrolyte. The volume fraction of the intermetallic particles included in the oxide formed on aluminum alloy 6061 is less than in the oxide formed on aluminum alloy 3003. This provides for both higher resistivity and higher breakdown voltages for the anodic films formed on aluminum alloy 6061.

When a surface defect 18 forms in the core 12, the anodization layer 14 and metallization 24 track the surface. The distance 26 between the metallization 24 and the core 12 is reduced, lowering the breakdown voltage. For optimum performance, the average surface roughness of the core 12, prior to anodization as measured on a laser surface profilometer such as the Rodenstock model RM 600, manufactured by Rodenstock of Munich, Germany, is less than about 1.5 micron and preferably less than about 0.3 micron.

After components are stamped from the aluminum alloy core, the components are deburred by tumbling in an abrasive medium. The tumbling concurrently increases the roughness of the component surfaces. Wet deburring increases the surface roughness the least and is preferred to maximize breakdown voltage. One suitable wet deburring process involves placing the components in an oscillating bowl having an amplitude of from about 1/64 inch up to about 1/4 inch. A combination of abrasive media of different sizes is added as is a fluid medium. Typically, the fluid is an aqueous soap solution and the abrasive, a mixture of large (4.8 mm×8.7 mm) ceramic cylinders, small (6 mm) diameter ceramic spheres and a fine (200 mesh) powder that provides lubricity.

Smoother components are obtained by hard anodizing in a sulfuric acid electrolyte (10%–20%, by weight sulfuric acid) at about 10–15 amps per square foot of direct current with the aluminum alloy core as the anode. While the anodic film is transparent, there may be some applications in which an integral color is not required.

The anodic films formed by integral color anodization owe their color to the presence in the anodic film of intermetallics that cause multiple reflections of light. These intermetallics reduce the breakdown voltage. Additionally, incorporation of the intermetallics into the oxide during anodization causes toughening of both the oxide-metal interface and the oxide surface.

A very smooth surface with a high breakdown voltage is achieved by hard anodizing aluminum alloys of the 5000 series such as aluminum alloy 5252 (nominal composition by weight 2.2%–2.8% magnesium, balance aluminum), aluminum alloy 5657 (0.6%–1.0% magnesium, balance aluminum) and aluminum alloy 5457 (0.08%–1.2% magnesium, 0.15%–0.45% manganese, balance aluminum).

The 5000 series alloys are reduced to final gauge by passing through polished rolls of a rolling mill. After components are stamped, the components are chemically polished by immersion in a 95% by weight phosphoric acid, 5% by weight nitric acid heated to 95° C.–100° C. Immersion time in the polish is about 4 minutes.

Anodization is in an aqueous solution containing from about 5% to about 20%, by weight, sulfuric acid and preferably containing from about 10% to about 15%, by weight, sulfuric acid. The more dilute electrolytes produce a harder, smoother anodic film.

Anodic films formed on aluminum alloys during integral color anodization are duplex in nature consisting of a thin barrier layer 28 adjacent to the metal core with a thick outer layer adjacent to the barrier layer. The thick outer layer contains a high frequency of pores with a diameter in the range of 75 to 200 angstroms. During metallization, the metallization or chemicals such as photoresist or developer can deposit in the pores. These chemicals corrode the anodic film, reducing the breakdown voltage.

The breakdown voltage is increased by sealing the pores by any suitable process. One suitable process is chemical sealing by immersing the component in an aqueous solution containing 5 g/l nickel acetate and 5 g/l boric acid. The aqueous solution is heated to 80° C. and the component immersed for about 5 minutes. Typically, the component is then immersed in boiling water for an additional 20 minutes.

A second suitable sealing process is physical sealing, coating the surface of the anodic film with a second layer, such as a dielectric polymer. This dielectric polymer seals the pores, reduces the surface roughness and increases the breakdown voltage.

Figure 2:
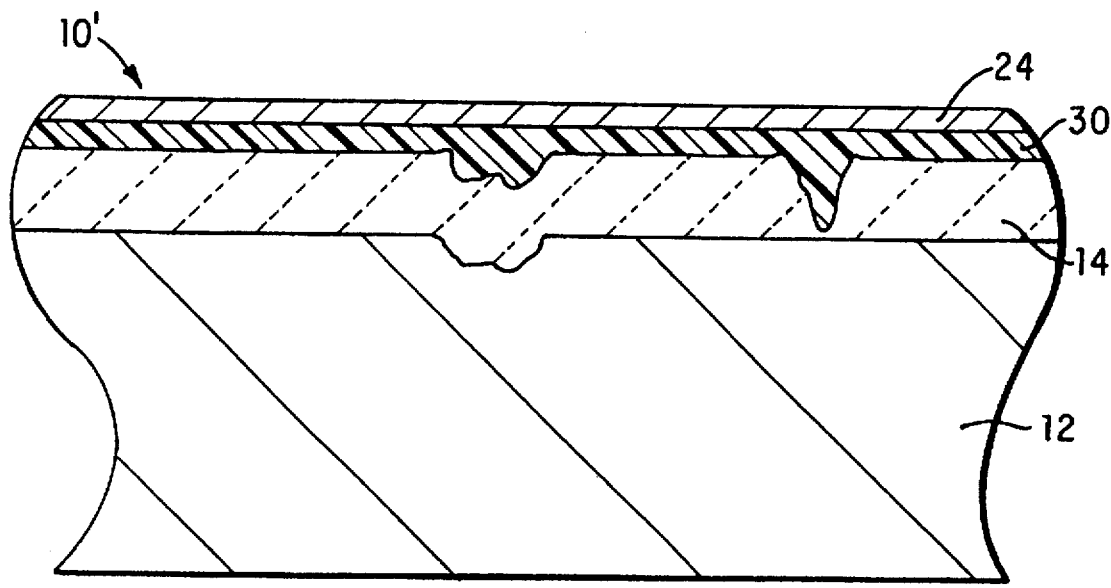
FIG. 2 shows in cross-sectional representation an anodized substrate sealed with polymeric solution.

A dielectric polymer 30 is illustrated in FIG. 2. The polymer 30 is disposed between the anodization layer 14 and the metallization 24 to ensure that the metallization 24 does not approach the core 12 by a distance less than the thickness of the polymer 30. The polymer 30 is a thermal insulator and if one or more semiconductor devices are mounted on the substrate 10'. To remove heat from the semiconductor devices it is desirable to minimize thermal resistance. Therefore, the thickness of the polymer layer 30 is from about 0.0025 mm to about 0.051 mm (0.0001–0.002 inch) and preferably from about 0.005 mm to about 0.015 mm (0.0002–0.0006 inch).

The desired polymer thickness is achieved by a self-levelling, liquid dielectric polymer that thermally cures to a coating having high adhesion to the anodic layer and resists heat, moisture, solvents and chemicals. The preferred coating is an epoxy having an epoxy cresol novolac base combined with an aromatic hardener with multi-functionality.

The resultant coating has high adhesion due to the hydroxyl groups, a high resistance to heat and moisture, at temperatures up to 300° C. due to the high aromatic content rendering it hydrophobic and a high resistance to solvent and chemicals by being highly cross-linked. Ordinary hardeners, such as amines, amides, carboxylic acids and acid anhydrides, are not preferred. In addition to being hydrophilic, these hardeners lower the moisture, heat and chemical resistance of the epoxy coating.

Selective additives, such as surfactants, defoamers, levelling agents and mixtures thereof, may be present in the coating, but are kept to a minimum. Typically these additives are present in an amount of less than about 2% by weight, so as not to detract from the coating performance. Generally, when the epoxy solution is applied to an anodic film, wetting of the surface is sufficient that a surfactant is not required, although, small amounts, on the order of 0.001%–0.01% are beneficial. If the epoxy is applied directly to a metal surface, such as directly to the aluminum alloy core, then the inclusion of a surfactant such as a fluoro-aliphatic polymer ester is desirable. One such surfactant is FC-430 manufactured by the 3M Company, St. Paul, Minn.

An accelerator, such as an imidazole derivative, may be added to increase the reaction rate in the temperature range of from about 100° C. to about 200° C.

The polymeric solution has a low room temperature (20° C.) viscosity, on the order of from about 10 to about 1000 centipoise and preferably, from about 15 to about 500 centipoise. The viscosity is dependent on the choice of solvent and the percent solids present. The percent solids in the solution is kept relatively low, from about 15% to about 70% solids and preferably on the order of about 20% to about 60% solid.

The benefits of maintaining the viscosity and the percent solids at low levels are that, first, the polymer solution is immediately absorbed by the anodic film filling in pores, crevices and other defects. Second, it enables deposition of a very thin film, on the order of 1 to 2 microns by any suitable process such as dipping or spraying. Third, the liquid polymer is self-levelling and reduces the apparent surface roughness of the component 10'. Fourth, the liquid polymer readily forms a continuous film at very low thicknesses.

A suitable polymer composite is, by weight, from about 58% to about 88% of an epoxy cresol novolac; from about 30% to about 40% of a substantially aromatic hardener having multi-functionality; from about 0.1% to about 1% of an accelerator; and from about 0.001% to about 1% of an additive selected from the group consisting of surfactants, defoamers, levelling agents and mixtures thereof.

A preferred polymer composite, by weight, is: from about 60.5% to about 68.5% of an epoxy cresol novolac; from about 10% to about 40% of a substantially aromatic hardener having multi-functionality; from about 0.5% to about 0.6% of an accelerator and from about 0.001% to about 0.002% of a surfactant. One preferred polymer composition diluted approximately 50% in a solvent is, by weight:

Epoxy cresol novolac resin 33.5%

Cresol novolac hardener 15.2%

2 methyl imidizole 0.3%

Florad Surfactant 0.001%

Acetone 50.999%

ECN 9511 (Epoxy cresol novolac resin), HT 9690 (Cresol novolac hardener) and 2 methyl imidazole are available from Ciba-Geigy, Ardsley, N.Y. FC-430 (florad surfactant) is available from 3M.

This polymer is cured by heating to from about 150° C. to about 200° C. for from about 30 minutes to about 2 hours.

Figure 3:
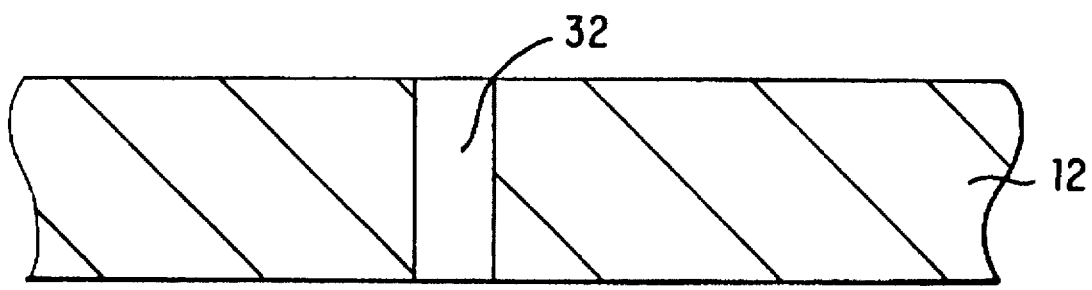
FIGS. 3–5 show in cross-sectional representation the assembly of a printed circuit board formed from the substrate of the invention.
Figure 4:
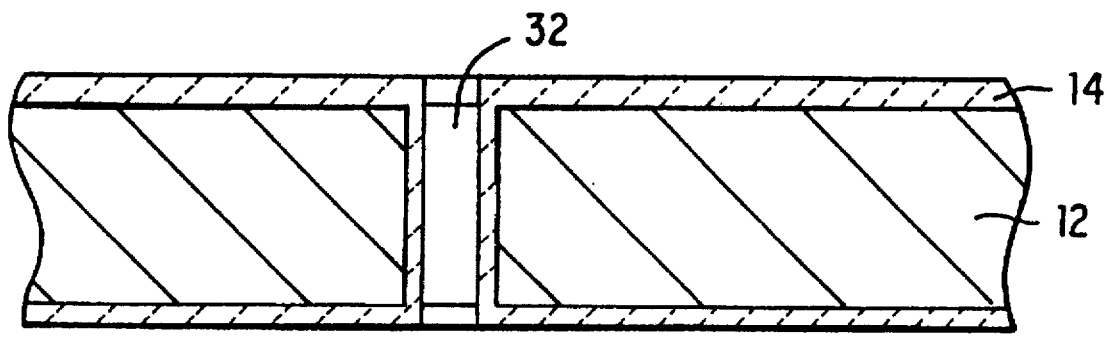
Figure 5:
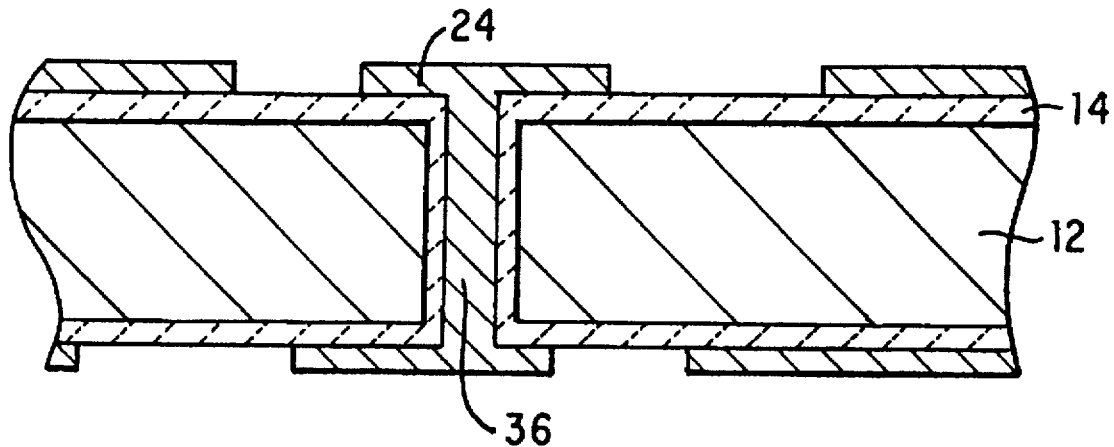

The anodized aluminum components of the invention are particularly suited for printed circuit boards and electronic packages. FIGS. 3–5 illustrate the manufacture of a printed circuit board. As shown in FIG. 3, there is provided an aluminum alloy core 12 that may contain one or more through holes 32.

The aluminum alloy core 12 and the walls of the through holes 32 are coated with an anodization layer 14 as shown in FIG. 4. The anodization layer 14 has a thickness of from about 0.0025 mm to about 0.13 mm (0.0001–0.003 inch) and preferably from about 0.013 mm to about 0.075 mm (0.0005–0.003 inch). While any anodization process is satisfactory, integral color anodization is preferred.

Circuitry, such as copper or a copper alloy metallization 24 is formed on the anodization layer 14 as shown in FIG. 5 or on an intervening polymer layer as shown in FIG. 2. Referring back to FIG. 5, the metallization forms circuit traces 2 on one or more anodized surfaces and extends continuously through any through holes 32 forming a conductive via 36. The metallization is applied by any suitable process such as evaporation, sputtering, electroless plating, plasma vapor deposition or jet vapor deposition as disclosed in U.S. Pat. No. 5,256,205 to Schmitt, III et al. that is incorporated by reference in its entirety herein. The circuit traces 24 can be formed by a subtractive process in which all exposed circuits are coated with the metallization, a suitable photoresist is applied over the conductive metal and photo-imaged to expose a desired circuit pattern. A suitable etchant, one that removes the exposed metallization without corroding the anodized film, for example an ammonium hydroxide based etchant when the metallization is copper, then removes unwanted metallization, forming the desired pattern of circuit traces 24. The remaining photoresist is then removed with a suitable solvent.

Figure 6:
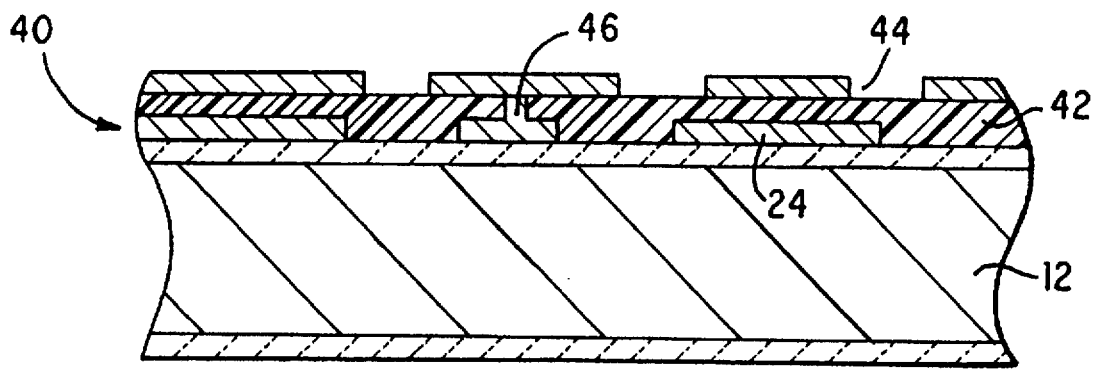
FIG. 6 shows in cross-sectional representation a multilayer printed circuit board formed from the substrate of the invention.

As shown in FIG. 6, multi-metal layer printed circuit boards 40 are manufactured by applying a dielectric layer 42 over a first pattern of circuit traces 24 and forming a second layer of circuit traces 44 over the dielectric layer 42. Conductive vias 46 may be employed to electrically interconnect the two or more layers of circuit traces. While FIG. 6 illustrates a multi-layer structure on only one side of the aluminum alloy core 12, it is within the scope of the invention to provide a multi-layer structure on both sides of the core and to have conductive vias extending through the core as illustrated in FIG. 5.

Figure 7:
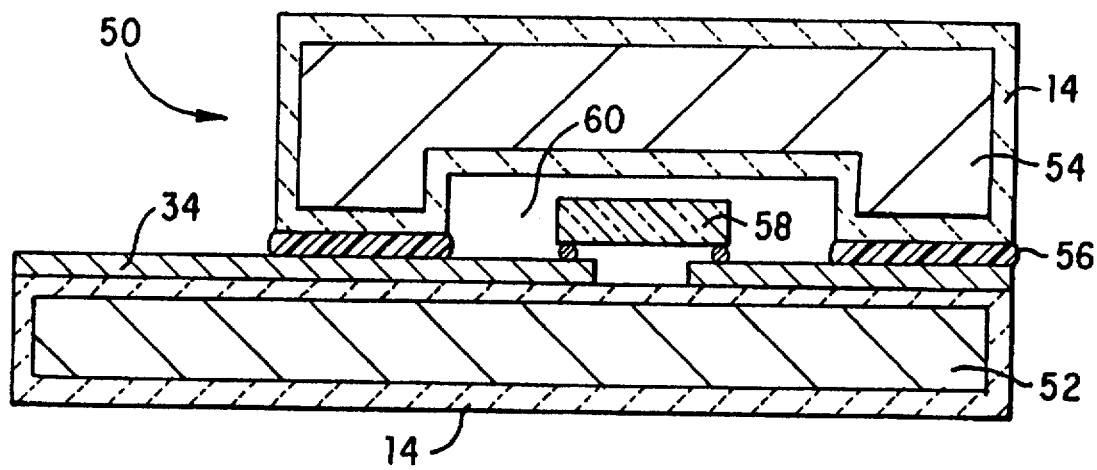
FIG. 7 shows in cross-sectional representation an electronic package formed from the substrate of the invention.

The anodized aluminum components of the invention are also suitable for electronic package components as illustrated in FIG. 7. The electronic package 50 has a base component 52 and cover component 54 joined together by an appropriate adhesive 56, such as a thermosetting epoxy. An anodization layer 14 preferably coats both the base component 52 and cover component 54 to provide electrical isolation. An integrated circuit device 58 is housed within a cavity 60 that is defined by the base component 52 and cover component 56. The integrated circuit device 58 is electrically interconnected to circuit traces 34 formed on the anodization layer 14. Any suitable electrical interconnection may be used, including wire bonds, thin strips of copper foil as utilized in tape automated bonding and direct soldering of electrically active input/output pads on the semiconductor device to the circuitry as utilized in flip chip bonding. Collapsible solder balls 62 formed from a lead/tin alloy are particularly suited for flip chip bonding.

While FIG. 7 illustrates an edge connectable electronic package, the invention is applicable to any type of electronic package, including leaded packages, leadless packages and array-type packages, including pin grid arrays, ball grid arrays and pad grid arrays.

The advantages of the invention will become more apparent from the examples that follow.

EXAMPLES

Figure 8:
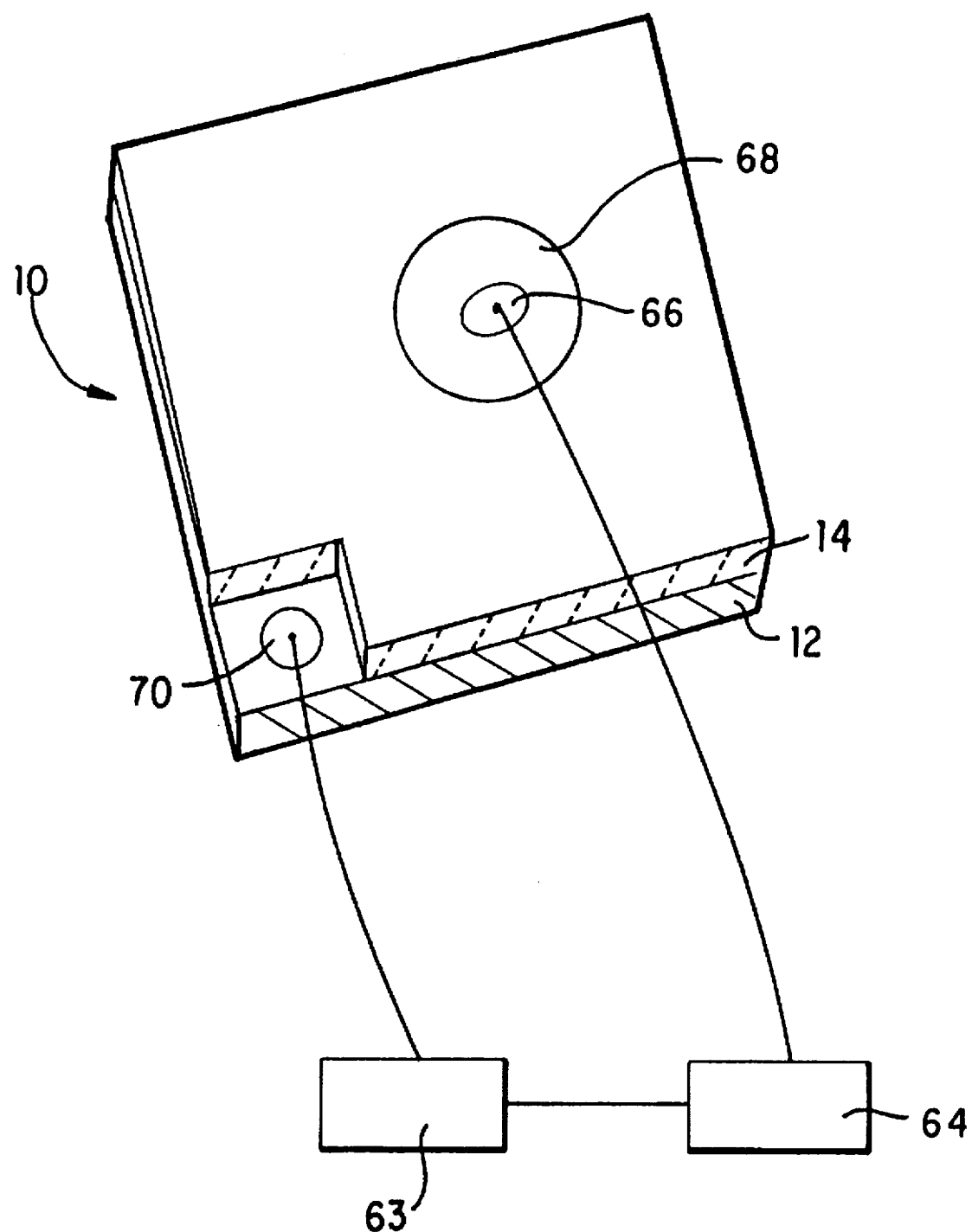
FIG. 8 illustrates an apparatus for measuring the breakdown voltage.

The breakdown voltage of an anodized aluminum component 10 was determined utilizing the apparatus illustrated in FIG. 8. A power controller 63 was electrically interconnected in series with an amp meter 64. A first probe 66 was bonded to the anodic film 14 by a silver-filled epoxy resin 68. The area of contact between the silver-filled epoxy resin 68 and the anodic film 14 was accurately measured so that the area over which the voltage was applied could be accurately determined. A second probe 70 was electrically interconnected directly to the aluminum alloy core 12. The voltage provided by the power controller 62 was then gradually increased until the amp meter 64 registered current flow through the anodic film 14. The minimum voltage for current flow was the breakdown voltage.

Table 1 compares the breakdown voltage of aluminum alloy components coated with a 0.025 mm (0.001 inch) anodic film formed by integral color anodization. The direct chill (D.C.) cast alloy A3003 had intermetallics with an average maximum axis length of 16 microns. The strip cast aluminum alloy A3003 had intermetallics with an average maximum axis length of 8 microns. The aluminum alloy A6061 was D.C. cast and had intermetallics that are substantially soluble in a sulfuric acid based electrolyte and the anodic film was essentially intermetallic free.

TABLE 1

| Substrate | Measured Breakdown Voltage | Average Breakdown Voltage |
|---|---|---|
| D.C. Cast A3003 | 10, 15, 71, 55, 71 46, 17, 10 | 37 |
| Strip Cast A3003 | 193, 190, 126, 183, 128, 136, 176, 207, 220, 165, 226, 197, 153, 110, 165, 187, 140, 32, 10, 10 | 148 |
| D.C. Cast A6061 | 133, 450, 249, 186, 351, 142, 84, 356, 289, 157, 161, 180, 313, 148, 163, 500, 170, 185 | 244 |

Table 2 compares the breakdown voltage of two aluminum alloy 5252 components and illustrate the increased breakdown voltage achieved with a smoother core surface and hard anodization as compared to an integral color anodized aluminum alloy 6061 component.

TABLE 2

| Alloy Condition | Average Surface Roughness (micron) | Maximum Surface Roughness (micron) | Breakdown Voltage (volts) |
|---|---|---|---|
| Bright Roll - 5252 | 0.21 | 1.88 | 930 |
| Chemical Polish - 5252 | 0.11 | 0.97 | >1000 |
| Integral Color - 6061 | 0.92 | 7.45 | 258 |

The bright roll sample was reduced to final gauge by passing through a pair of polished rolls in a rolling mill. The chemical polish sample was reduced to final gauge by passing through a pair of polished rolls in a rolling mill and then polished by immersion for 4 minutes in a solution of 95% by weight phosphoric acid, 5% nitric acid at a solution temperature of 95° C.–100° C.

Table 3 illustrates how sealing the pores of an anodic film improves the breakdown voltage after subsequent processing, such as coating with a photoresist or metallization.

56 samples of aluminum alloy 6061-T6 components (32× 32 mm) were anodized in an aqueous solution of 60 g/l sulfosalicylic acid and 4.5 g/l sulfuric acid at a temperature of 12° C.–14° C. Anodization was commenced by linearly increasing the current density to 100 amps/foot$^2$ in 2 minutes. The direct current voltage was then increased to 68 volts and held constant for 15 minutes while permitting the current to decay. The samples were then air dried. The anodic film had a thickness of 0.018 mm.

One half the component samples were then sealed by immersing for 17 minutes in a nickel acetate solution at 85° C. at a pH of 5.8 followed by rinsing for 5 minutes in water at 70° C. at a pH of 5.8. The other half of the component samples were retained as unsealed.

The samples were then immersed in a 50% photoresist developing solution that contained a mixture of trisodium phosphate and sodium metasilicate at a pH of about 13 for 4 minutes. The samples were then water rinsed and dried in acetone.

TABLE 3

| Sample | Anodized | Anodized Developed | Anodized Sealed | Anodized Sealed Developed |
| --- | --- | --- | --- | --- |
| 1 | 619 | 390 | 405 | 259 |
| 2 | 367 | 484 | 300 | 203 |
| 3 | 341 | 230 | 248 | 248 |
| 4 | 303 | 200 | 380 | 362 |
| 5 | 395 | 188 | 394 | 429 |
| 6 | 424 | 218 | 469 | 442 |
| 7 | 292 | 101 | 400 | 360 |
| 8 | 354 | 214 | 214 | 490 |
| 9 | 322 | 258 | 209 | 498 |
| 10 | 374 | 265 | 364 | 280 |
| 11 | 368 | 318 | 296 | 338 |
| 12 | 391 | 239 | 336 | 386 |
| Average | 379 | 259 | 335 | 358 |

Breakdown Voltage (volts)

Table 4 illustrates the levelling effect of the dilute epoxy cresol novolac of the invention. The epoxy was diluted, by weight, in acetone to contain from 8.7%, by weight, solids up to 26% solids. Table 4 illustrates that excessive dilution negatively impacts the surface roughness and the sealing of the pores of the anodic film.

TABLE 4

| Substrate | Maximum Surface Roughness Microns | Average Surface Roughness Microns |
| --- | --- | --- |
| Uncoated A6061 | 33.7 | 3.36 |
| Epoxy Coating (26% Solids) A6061 | 11.9 | 0.77 |
| Epoxy Coating (13% Solids) A6061 | 29.0 | 3.24 |
| Epoxy Coating (8.7% Solids) A6061 | 28.7 | 3.19 |

Table 5 illustrates that the epoxy coating enhances both the breakdown voltage and the force required to separate an epoxy bonded stud from the substrate. This improvement is noted when comparing anodized A6061 to epoxy coated and anodized A6061. The improvement is also noted when comparing copper or nickel jet vapor deposited metallizations on anodized A6061 with the same metallizations on epoxy coated, anodized A6061. The improved adhesion of the metallized substrates noted for the jet vapor deposition process is believed to be equally applicable to other deposition processes such as sputtering, evaporation and the like.

TABLE 5

| Substrate | Average Breakdown Voltage | Coating | Average Pull Force (pounds) |
| --- | --- | --- | --- |
| A6061 | 290 | None | 89 |
| A6061 Epoxy coated (26% solids) | 600+ | None | 99 |
| A6061 | 63 | Copper | 87 |
| A6061 | 174 | Nickel | 35 |
| A6061 Epoxy coated (26% solids) | 600+ | Copper | 112 |
| A6061 Epoxy coated (26% solids) | 321 | Nickel | 68 |

While the invention has been drawn to anodized aluminum, it is believed to be equally applicable to other anodizable materials such as titanium, magnesium and their alloys. The benefits of the epoxy cresol novolac are believed applicable to all metallic substrates, whether anodized, otherwise coated or bare metal.

It is apparent that there has been provided in accordance with the present invention anodized aluminum substrates that have increased breakdown voltages, making the substrates particularly useful for both printed circuit board and electronic package components that fully satisfy the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A component for electronic applications comprising:

an anodizable metal core;

an anodic film containing pores having first and second opposing surfaces, said first surface bonded to said core; and a dielectric polymer filling said pores and constituting a continuous film that coats said anodic film except for said first surface, said continuous film having a thickness of from about 0.0025 mm to about 0.051 mm and being effective to reduce the average surface roughness of said component.

2. The component of claim 1 wherein said dielectric polymer is an epoxy cresol novolac.

3. The component of claim 2 wherein said dielectric polymer has an average thickness of from about 0.005 mm to about 0.015 mm.

4. A component for electronic applications comprising:

a metallic core;

a continuous film polymer coating said metallic core, said continuous film having a thickness of from about 0.0025 mm to about 0.051 mm and being effective to reduce the average surface roughness of said component and a metallized circuitry formed on an outwardly disposed surface of the continuous film polymer.

5. The component of claim 4 wherein said polymer is an epoxy cresol novolac.

6. The component of claim 3 wherein said dielectric polymer consists essentially of from about 58% to about 88%, by weight, of an epoxy cresol novolac;

from about 10% to about 40%, by weight, of an aromatic hardener;

from about 0.1% to about 1.0% of an accelerator; and from about 0.001% to about 1.0% of a surfactant.

7. The component of claim 5 wherein said dielectric polymer consists essentially of from about 58% to about 88%, by weight, of an epoxy cresol novolac;

from about 10% to about 40%, by weight, of an aromatic hardener;

from about 0.1% to about 1.0% of an accelerator; and from about 0.001% to about 1.0% of a surfactant.

* * * * *